(12) United States Patent
Tang et al.

(10) Patent No.: US 12,035,497 B2
(45) Date of Patent: Jul. 9, 2024

(54) DISPLAY DEVICE

(71) Applicants: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO. LTD., Wuhan (CN)

(72) Inventors: Jialiang Tang, Wuhan (CN); Kuihua You, Wuhan (CN)

( * ) Notice: Subject to any disclaimer, the term of this patent is extended or adjusted under 35 U.S.C. 154(b) by 0 days.

(21) Appl. No.: 17/598,278

(22) PCT Filed: Jul. 19, 2021

(86) PCT No.: PCT/CN2021/107178
§ 371 (c)(1),
(2) Date: Sep. 26, 2021

(87) PCT Pub. No.: WO2022/267123
PCT Pub. Date: Dec. 29, 2022

(65) Prior Publication Data
US 2024/0049413 A1     Feb. 8, 2024

(30) Foreign Application Priority Data
Jun. 22, 2021   (CN) .......................... 202110692159.4

(51) Int. Cl.
*H05K 5/03*     (2006.01)
*H10K 59/80*    (2023.01)

(52) U.S. Cl.
CPC ............... *H05K 5/03* (2013.01); *H10K 59/80* (2023.02)

(58) Field of Classification Search
CPC ..................................................... G06F 1/181
See application file for complete search history.

(56) References Cited

U.S. PATENT DOCUMENTS

| 2014/0055924 A1* | 2/2014 | Baek ..................... G06F 1/163 361/679.01 |
| 2016/0275830 A1* | 9/2016 | You ................... G02F 1/133305 |
| 2020/0196496 A1 | 6/2020 | Shin |

FOREIGN PATENT DOCUMENTS

| CN | 108281387 A | 7/2018 |
| CN | 110610904 A | 12/2019 |

(Continued)

OTHER PUBLICATIONS

International Search Report in International application No. PCT/CN2021/107178, mailed on Mar. 22, 2022.

(Continued)

*Primary Examiner* — Jerry Wu

(57) ABSTRACT

A display device provided. The display device includes a display portion and a bonding portion disposed opposite to each other and a bent portion connected between the display portion and the bonding portion; a support layer, including a second support portion close to a side of the bent portion; and a buffer portion, disposed on the second support portion. The bent portion includes a bent sub-portion. A length of the buffer portion in a first direction is greater than or equal to a distance from any position on the bent sub-portion to a first plane in the first direction. The first direction is a thickness direction along the display portion.

13 Claims, 8 Drawing Sheets

(56) References Cited

FOREIGN PATENT DOCUMENTS

| | | |
|---|---|---|
| CN | 111816082 A | 10/2020 |
| CN | 112071197 A | 12/2020 |
| CN | 112526780 A | 3/2021 |

OTHER PUBLICATIONS

Written Opinion of the International Search Authority in International application No. PCT/CN2021/107178, mailed on Mar. 22, 2022.

* cited by examiner

DISPLAY DEVICE

BACKGROUND

Technical Field

This application relates to the field of display technologies, and in particular, to a display device.

Related Art

In the modern communication industry, there are increasing market requirements for products such as mobile phones, televisions, tablet computers, laptop computers, and digital cameras, and various display devices are developing toward a larger size and a bendable property. A pad-bending technology is one of key technologies for realizing a narrow bezel of a flexible organic light-emitting diode (OLED) display panel. The technology is to bend a bent area in a terminal area of the display panel to a back side of the display panel by using a specific angle and a specific radius to realize a narrow bezel.

At present, a protection effect of a cover plate on a bent portion of the display panel is limited. Therefore, during assembling, the bending portion of the display panel easily squeezes and collides with other components. As a result, the bending portion of the display panel is easily damaged.

SUMMARY

Technical Problem

Embodiments of this application provide a display device, to prevent a bent portion of a display module from squeezing and colliding with other components. Therefore, a protection effect on the bent portion of a display panel is enhanced. In this way, the yield is increased.

Technical Solution

An embodiment of this application provides a display device, including:
- a display module, comprising a display portion and a bonding portion disposed opposite to each other and a bent portion connected between the display portion and the bonding portion;
- a support layer, comprising a first support portion disposed between the display portion and the bonding portion and a second support portion disposed on a side of the first support portion close to the bent portion, where a projection of the second support portion in a first direction is located outside a projection of the bent portion in the first direction, and the first direction is a thickness direction along the display portion; and
- a buffer portion, disposed on a side of the second support portion close to the display portion.

The bent portion comprises a bent sub-portion located on a side of a first plane facing the display portion. The first plane is a plane where a surface on a side of the second support portion away from the bonding portion is located. A length of the buffer portion in the first direction is greater than or equal to a distance from any position on the bent sub-portion to the first plane in the first direction.

In an embodiment of this application, the second support portion comprises at least two second support sub-portions located on a peripheral side of the bent portion, and the buffer portion comprises at least two buffer sub-portions. One buffer sub-portion is disposed on each support sub-portion.

In an embodiment of this application, the second support portion comprises the two second support sub-portions located on two opposite sides of the bent portion, and the buffer portion comprises the two buffer sub-portions located on the two opposite sides of the bent portion. One buffer sub-portion is disposed on each support sub-portion.

In an embodiment of this application, the first support portion and the second support portion are integrally disposed.

In an embodiment of this application, the buffer portion and the second support portion are integrally disposed.

In an embodiment of this application, the display portion comprises a first surface away from a side of the bonding portion. The bent portion comprises a second surface connected to the first surface. The display module further comprises a protective adhesive layer disposed on the second surface. The protective adhesive layer comprises a first protective adhesive layer corresponding to the bent sub-portion.

A length of the buffer portion in the first direction is greater than or equal to a distance from any position on the first protective adhesive layer to the first plane in the first direction.

In an embodiment of this application, a distance from the buffer portion to a plane where a surface of intersection of the display portion and the bent portion is located in a second direction is greater than or equal to a distance from any position on the protective adhesive layer to the plane where the surface of intersection of the display portion and the bent portion is located in the second direction. The second direction is perpendicular to the first direction.

In an embodiment of this application, the display device further comprises a first back plate layer and a metal support plate disposed between the display portion and the bonding portion. The support layer is the back plate layer or the metal support plate.

In an embodiment of this application, the display device further comprises a cover plate disposed on a side of the display portion away from the bonding portion. A distance from a top of the buffer portion to the cover plate in the first direction is less than or equal to 5 mm.

In an embodiment of this application, the display device further comprises an outer frame. The display module, the support layer, and the buffer portion are all disposed in the outer frame.

According to the foregoing objective of this application, a display device is provided, including:
- a display module, comprising a display portion and a bonding portion disposed opposite to each other and a bent portion connected between the display portion and the bonding portion;
- a support layer, comprising a first support portion disposed between the display portion and the bonding portion and a second support portion disposed on a side of the first support portion close to the bent portion, where a projection of the second support portion in a first direction is located outside a projection of the bent portion in the first direction, and the first direction is a thickness direction along the display portion;
- a buffer portion, disposed on a side of the second support portion close to the display portion; and
- an outer frame, where the display module, the support layer, and the buffer portion are all disposed in the outer frame.

The bent portion comprises a bent sub-portion located on a side of a first plane facing the display portion. The first plane is a plane where a surface on a side of the second support portion away from the bonding portion is located. A length of the buffer portion in the first direction is greater than or equal to a distance from any position on the bent sub-portion to the first plane in the first direction.

In an embodiment of this application, the second support portion comprises at least two second support sub-portions located on a peripheral side of the bent portion, and the buffer portion comprises at least two buffer sub-portions. One buffer sub-portion is disposed on each support sub-portion.

In an embodiment of this application, the second support portion comprises the two second support sub-portions located on two opposite sides of the bent portion, and the buffer portion comprises the two buffer sub-portions located on the two opposite sides of the bent portion. One buffer sub-portion is disposed on each support sub-portion.

In an embodiment of this application, the first support portion and the second support portion are integrally disposed.

In an embodiment of this application, the buffer portion and the second support portion are integrally disposed.

In an embodiment of this application, the display portion comprises a first surface away from a side of the bonding portion. The bent portion comprises a second surface connected to the first surface. The display module further comprises a protective adhesive layer disposed on the second surface. The protective adhesive layer comprises a first protective adhesive layer corresponding to the bent sub-portion.

A length of the buffer portion in the first direction is greater than or equal to a distance from any position on the first protective adhesive layer to the first plane in the first direction.

In an embodiment of this application, a distance from the buffer portion to a plane where a surface of intersection of the display portion and the bent portion is located in a second direction is greater than or equal to a distance from any position on the protective adhesive layer to the plane where the surface of intersection of the display portion and the bent portion is located in the second direction. The second direction is perpendicular to the first direction.

In an embodiment of this application, the display device further comprises a first back plate layer and a metal support plate disposed between the display portion and the bonding portion. The support layer is the back plate layer or the metal support plate.

In an embodiment of this application, the display device further comprises a cover plate disposed on a side of the display portion away from the bonding portion. A distance from a top of the buffer portion to the cover plate in the first direction is less than or equal to 5 mm.

Beneficial Effects

The display module in this application includes the display portion and the bonding portion disposed opposite to each other, the bent portion configured for bending and connected to the display portion, and the support layer. The support layer includes the first support portion located between the display portion and the bonding portion and the second support portion extending from the first support portion to the bent portion. According to this application, the buffer portion is disposed on the side of the second support portion close to the display portion, and the length of the buffer portion in the first direction is greater than a distance from any position on the bent portion to the support layer in the first direction. The first direction is the thickness direction along the display portion. The buffer portion can avoid squeeze and collision between the bent portion and other components close to a side of the display portion. Therefore, the yield of the display panel can be increased.

BRIEF DESCRIPTION OF THE DRAWINGS

The following describes specific implementations of this application in detail with reference to the accompanying drawings, to make the technical solutions and other beneficial effects of this application obvious.

DETAILED DESCRIPTION

The technical solutions of the embodiments of this application are clearly and completely described in the following with reference to the accompanying drawings of the embodiments of this application. Apparently, the described embodiments are merely some but not all of the embodiments of this application. All other embodiments obtained by a person skilled in the art based on the embodiments of this application without creative efforts shall fall within the protection scope of this application.

Many different implementations or examples are provided below to implement different structures of this application. To simplify the disclosure of this application, the following describes components and settings of particular examples. Certainly, the components and settings are merely examples, and are not intended to limit this application. In addition, in this application, reference numbers and/or reference letters may be repeated in different examples. Such repetition is intended to simplify and clarify this application, and does not indicate a relationship between various implementations and/or settings that are discussed. In addition, this application provides examples of various specific processes and materials, but a person of ordinary skill in the art may be aware of application of other processes and/or use of other materials.

Figure 1:
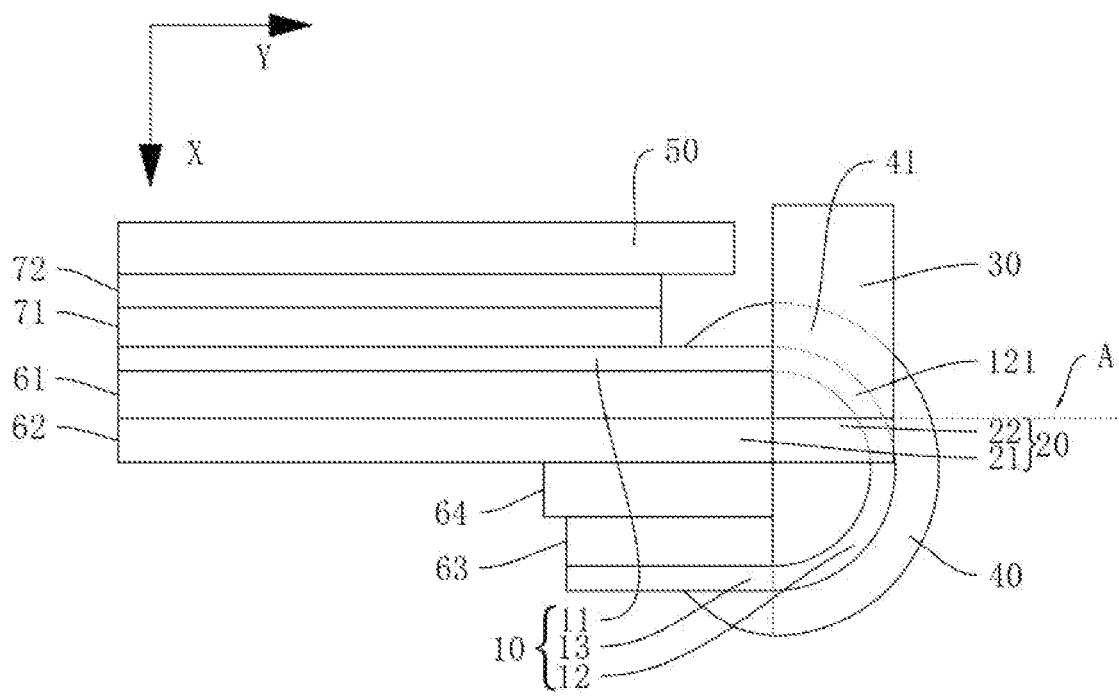
FIG. 1 is a schematic structural cross-sectional view of a display device according to an embodiment of this application.

An embodiment of this application provides a display device. Referring to FIG. 1, the display device includes a display module 10, a support layer 20, and a buffer portion 30.

The display module 10 includes a display portion 11 and a bonding portion 13 disposed opposite to each other and a bent portion 12 connected between the display portion 11 and the bonding portion 13.

The support layer 20 includes a first support portion 21 disposed between the display portion 11 and the bonding portion 13 and a second support portion 22 disposed on a side of the first support portion 21 close to the bent portion 12. A projection of the second support portion 22 in a first direction X is located outside a projection of the bent portion 12 in the first direction X. The first direction X is a thickness direction along the display portion 11.

The buffer portion 30 is disposed on a side of the second support portion 22 close to the display portion 11.

The bent portion 12 includes a bent sub-portion 121 located on a side of a first plane A facing the display portion 11. The first plane A is a plane where a surface on a side of the second support portion 22 away from the bonding portion 13 is located. A length of the buffer portion 30 in the first direction X is greater than or equal to a distance from any position on the bent sub-portion 121 to the first plane A in the first direction X.

In this embodiment of this application, the buffer portion 30 is disposed on the side of the support layer 20 close to the bent portion 12, and the buffer portion 30 may protrude from an upper surface of the bent sub-portion 121. Therefore, during implementation, squeeze and collision between the bent sub-portion 121 and other components such as an outer frame disposed around the display module close to a side of the display portion 11 can be avoided. Thus, by means of the display device provided in this embodiment of this application, a probability of damage to the bent portion 12 of the display module during assembling and usage can be reduced, and the yield and reliability of the display device can be increased.

Figure 2:
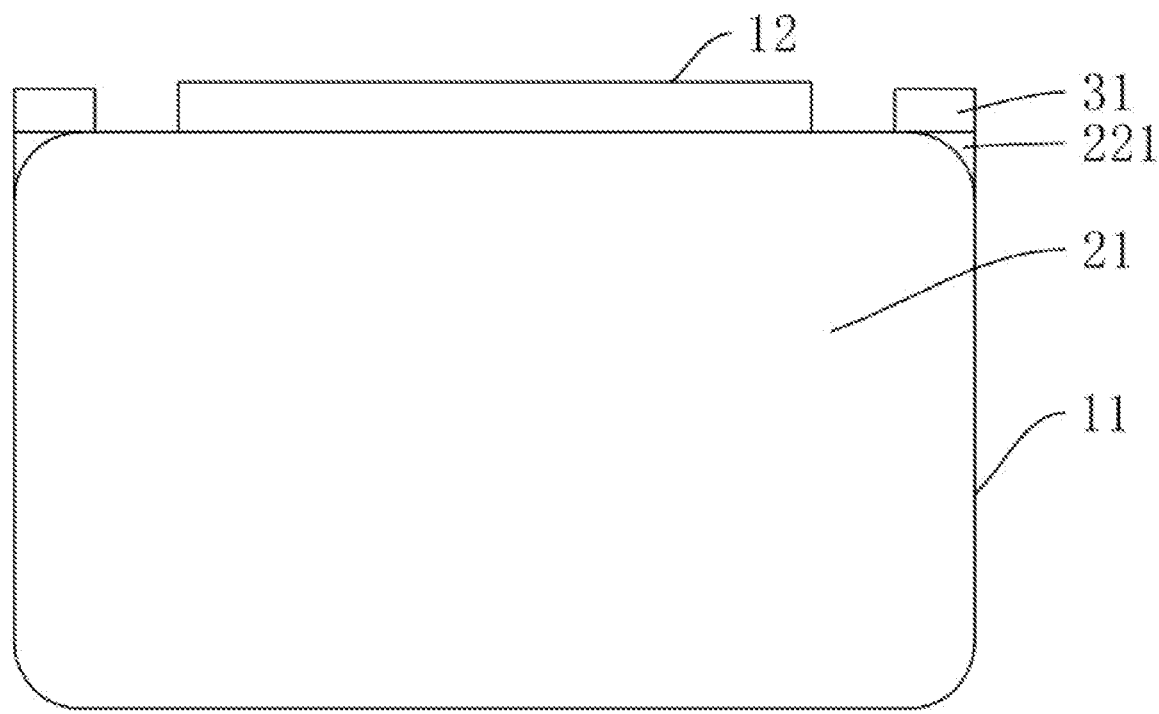
FIG. 2 is a schematic structural top view of a display device according to an embodiment of this application.
Figure 3:
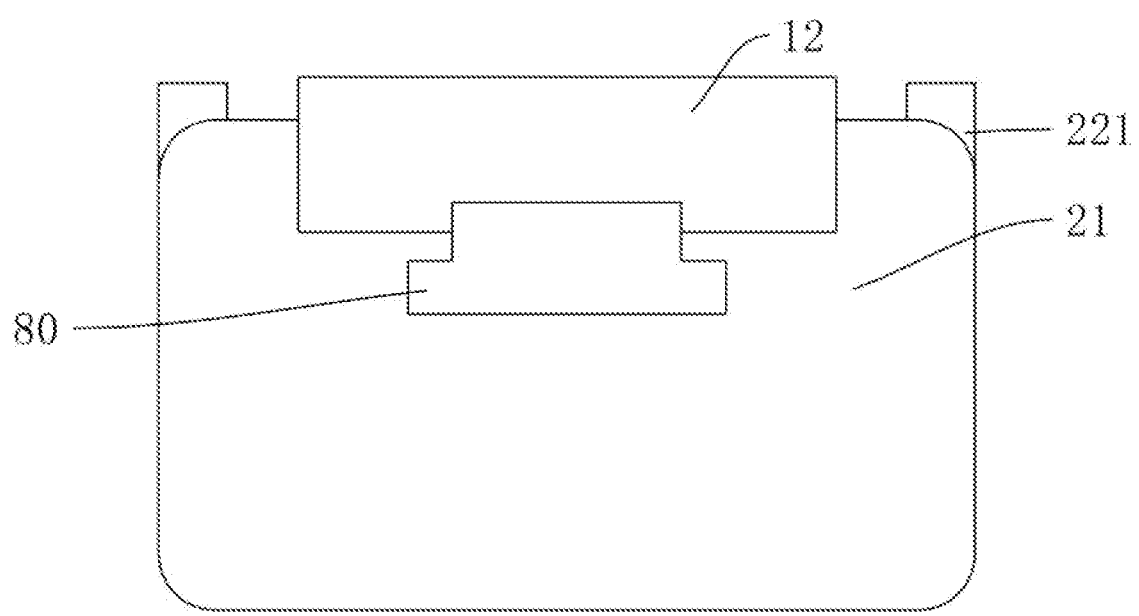
FIG. 3 is a schematic structural bottom view of a display device according to an embodiment of this application.

It should be noted that, the display module 10 includes a flexible substrate and a display function layer (not shown in the figure) disposed on the flexible substrate. The display function layer is disposed on the flexible substrate corresponding to the display portion 11. In addition, the flexible substrate is bent toward a side away from a display face of the display portion 11. The flexible substrate is bent and extended to the side away from the display face of the display portion 11, to form the bent portion 12 and the bonding portion 13. The display device further includes driving assemblies such as a flexible circuit board 80 bound to the bonding portion 13. In order to enhance bending performance of the bent portion 12, a width of the bent portion 12 is set to be less than a width of the display portion 11, as shown in FIG. 2 and FIG. 3, so as to reserve a specific space on two opposite sides of the bent portion 12.

A polarizing layer 71 and a cover plate 50 are disposed on a side of the display portion 11 on which the display face is located. The polarizing layer 71 is attached to the cover plate 50 by using an optical adhesive layer 72.

A first back panel layer 61 and a metal support plate 62 are further disposed on a side of the display portion 11 facing away from the display face, to provide support and protection for the display portion 11. In addition, a spacer portion 64 and a second back panel layer 63 are further disposed between the metal support plate 62 and the bonding portion 13, to provide support for the bonding portion 13.

In this embodiment, the support layer 20 is the metal support plate 62. Subsequent description is provided by using the support layer 20. The support layer 20 includes a first support portion 21 located between the display portion 11 and the bonding portion 13 and a second support portion 22 located on a side of the first support portion 21 close to the bent portion 12. One end of the second support portion 22 is connected to the first support portion 21, and another end of the second support portion extends toward the bent portion 12.

Further, a surface on the side of the second support portion 22 away from the bonding portion 13 is set as a first plane A. In this case, the bent portion 12 includes the bent sub-portion 121 located on a side of the first plane A close to the display portion 11. The projection of the second support portion 22 in the first direction X is located outside a projection of the bent sub-portion 121 in the first direction X.

The display device provided in this embodiment further includes the buffer portion 30 disposed on the side of the second support portion 22 close to the display portion 11. The length of the buffer portion 30 in the first direction X is greater than or equal to a distance from any position on the bent sub-portion 121 to the first plane A in the first direction X. In this way, squeeze and collision between the bent portion 12 and other components on the side of the display face of the display portion 11 can be avoided.

It should be noted that, the second support portion 22 includes at least two second support sub-portions 221 disposed on a peripheral side of the bent portion 12. Correspondingly, the buffer portion 30 includes at least two buffer sub-portions 31. One buffer sub-portion 31 is disposed on each second support sub-portion 221.

In this embodiment, referring to FIG. 2 and FIG. 3, the second support portion 22 includes two second support sub-portions 221 located on two opposite sides of the bent portion 12, and the buffer portion 30 includes two buffer sub-portions 31 located on the two opposite sides of the bent portion 12. One buffer sub-portion 31 is disposed on each second support sub-portion 221. In this embodiment, by means of the second support sub-portions disposed on the two opposite sides of the bent portion 12, the two sides of the bent portion 12 can be protected. In this way, the bent portion 12 can be prevented from squeezing and colliding with the other components located on the side of the display face of the display portion 11.

The display portion 11 includes a first surface away from a side of the bonding portion 13, and the bent portion 12 includes a second surface connected to the first surface. Optionally, the display module further includes a protective adhesive layer 40 disposed on the second surface. The protective adhesive layer 40 includes a first protective adhesive layer 41 disposed corresponding to the bent sub-portion 121. The length of the buffer portion 30 in the first direction X is greater than or equal to a distance from any position on the first protective adhesive layer 41 to the first plane A in the first direction X. Therefore, indirect squeeze on the bent portion 12 as a result of squeeze and collision by the other components on the side of the display face of the display portion 11 on the protective adhesive layer 40 can be further avoided. In this way, the yield of the bent portion 12 is increased.

Further, a distance from a top of the buffer portion 30 to the cover plate 50 in the first direction X is less than or equal to 5 mm. That is to say, in this embodiment, the top of the buffer portion 30 may protrude out of an upper surface of the cover plate 50, and the buffer portion protrudes out of the upper surface of the cover plate 50 by a distance less than or equal to 5 mm.

In this embodiment, the buffer portion 30 may be a spacer disposed on the second support portion 22, and a material of the buffer portion 30 includes foam.

Further, the display device provided in this embodiment includes an outer frame (not shown in the figure). The display module 10, the support layer 20, and the buffer portion are disposed in the outer frame. The outer frame is disposed around peripheral edges of the display module 10. It should be noted that, the buffer portion 30 may be disposed on the two opposite sides of the bent portion 12, and the top of the buffer portion 30 may protrude out of a side of the bent portion 12 close to the display face of the display device. In this embodiment, the top of the buffer portion 30 is in tight contact with the outer frame, and a specific degree of squeeze is allowed. Therefore, not only the buffer portion 30 is reinforced, but also squeeze and collision between the bent portion 12 and the outer frame can be avoided.

In this embodiment of this application, the bent portion 12 is located on a side edge of the display module 10. Thus, during assembling, squeeze and collision with the outer frame easily occur, causing damage to the bent portion 12. However, in the display device provided in this embodiment, the extended second support portion 22 is disposed on a side of the support layer 20 facing the bent portion 12, and the buffer portion 30 that may protrude out of a side of the bent portion 12 facing the display face of the display device is disposed on the second support portion 22. Therefore, squeeze and collision between the bent portion 12 and the outer frame can be avoided. In this way, the yield of the bent portion 12 is increased, and the reliability of the display device is enhanced.

Figure 4:
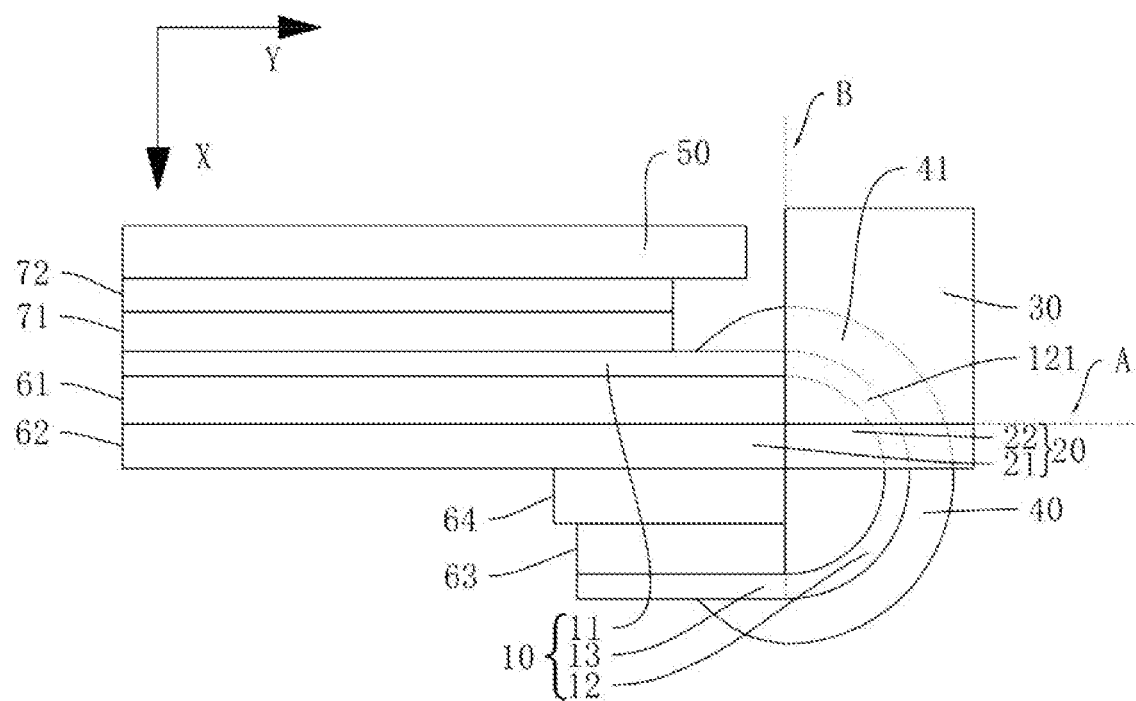
FIG. 4 is another schematic structural cross-sectional view of a display device according to an embodiment of this application.
Figure 5:
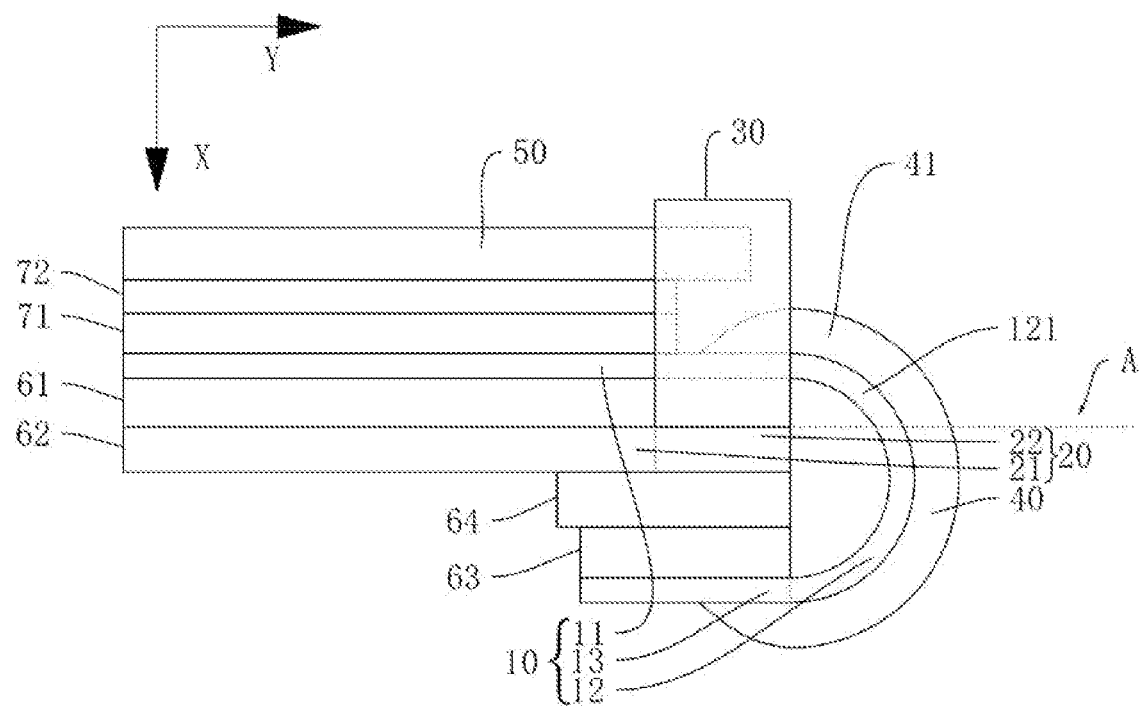
FIG. 5 is another schematic structural cross-sectional view of a display device according to an embodiment of this application.
Figure 6:
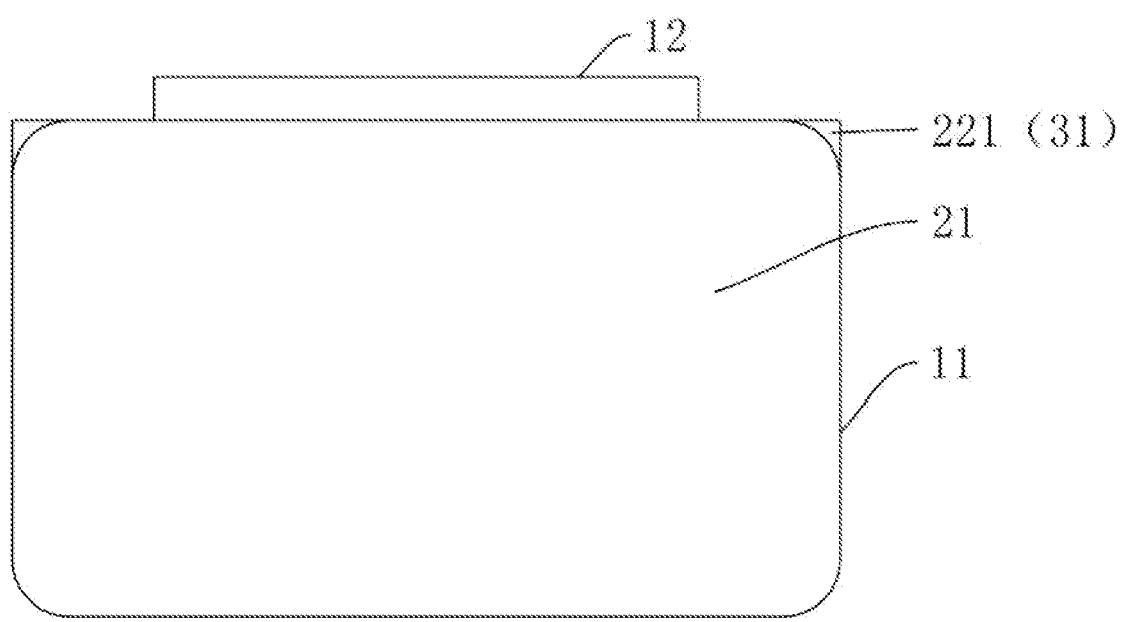
FIG. 6 is another schematic structural top view of a display device according to an embodiment of this application.
Figure 7:
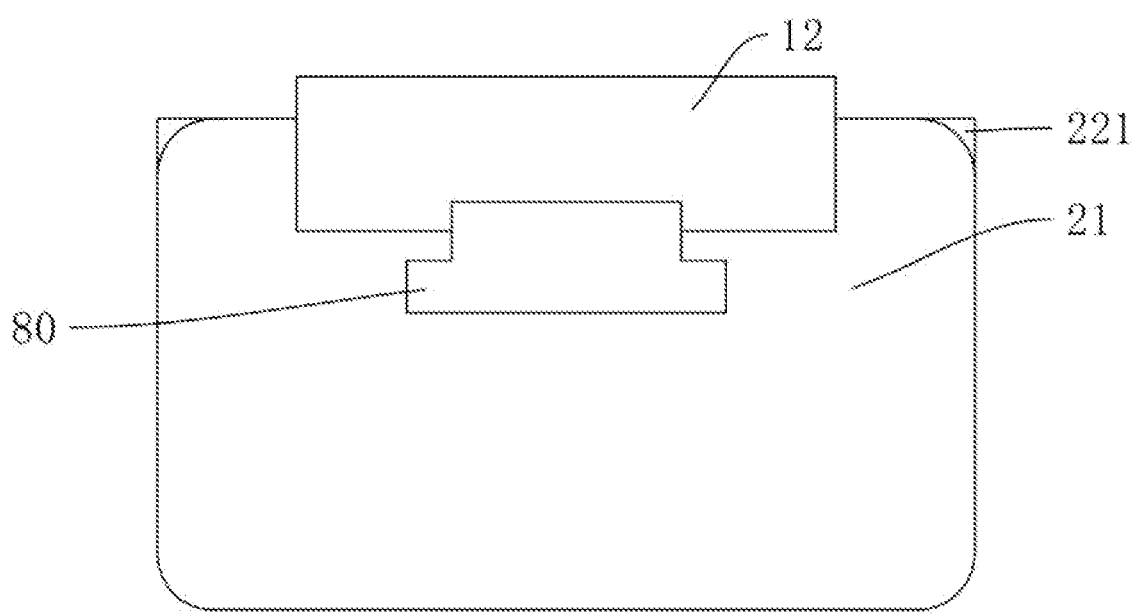
FIG. 7 is another schematic structural bottom view of a display device according to an embodiment of this application.
Figure 8:
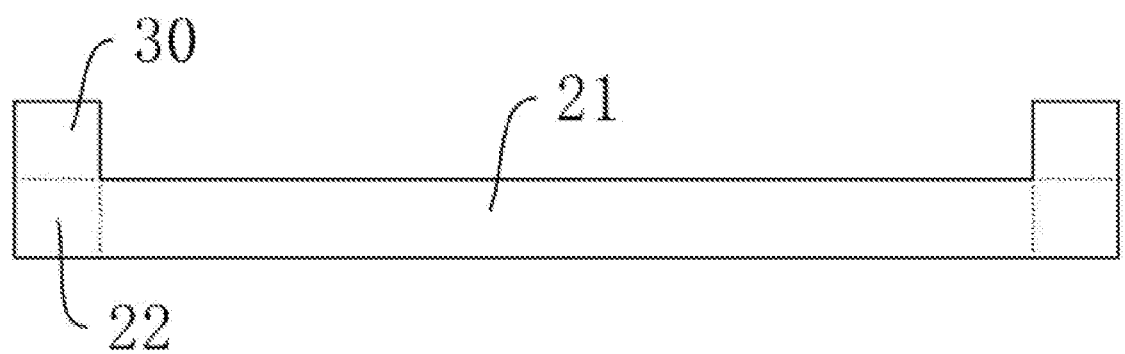
FIG. 8 is a schematic structural diagram of a support layer according to an embodiment of this application.

In another embodiment of this application, referring to FIG. 4, in this embodiment, a size of the buffer portion 30 is further limited on a basis of the first embodiment.

A plane where a face of intersection of the display portion 11 and the bent portion 12 is located is set as a second plane B, and a direction perpendicular to the first direction X is set as a second direction Y. In this embodiment, a distance from the buffer portion 30 to the second plane B in the second direction Y is greater than or equal to a distance from any position on the bent portion 12 to the second plane B in the second direction Y. Therefore, the bent portion 12 can be prevented from squeezing the other components not only in the first direction X, but also in the second direction Y. In this way, the yield of the bent portion 12 is further increased, and the reliability of the display device is further enhanced.

Further, in this embodiment, the display portion 11 includes a first surface away from a side of the bonding portion 13, and the bent portion 12 includes a second surface connected to the first surface.

Optionally, the display module further includes a protective adhesive layer 40 disposed on the second surface. A length of the buffer portion 30 in the second direction Y is greater than or equal to a distance from any position on the protective adhesive layer 40 to the first plane A in the second direction Y. Therefore, indirect squeeze on the bent portion 12 as a result of squeeze and collision by the other components in the second direction Y on the protective adhesive layer 40 can be avoided. In this way, the yield of the bent portion 12 is increased.

In another embodiment of this application, referring to FIG. 5, FIG. 6, FIG. 7, and FIG. 8, a difference between this embodiment and the first embodiment is that the first support portion 21 and the second support portion 22 are integrally disposed and the second support portion 22 may be disposed at a corner of the first support portion 21.

In detail, the second support portion 22 includes two second support sub-portions 221 located on two opposite sides of the bent portion 12. The two second support sub-portions 221 are disposed at two corners of the first support portion 21.

In a manufacturing process, chamfering is usually required for the flexible substrate, the first back panel layer 61, and the support layer 20 corresponding to the display portion 11. In this embodiment, two corners on the side of the support layer 20 close to the bent portion 12 are not chamfered, or the two corners are formed differently from the corners of the flexible substrate and the first back panel layer 61, the flexible substrate and the first back panel layer 61 are chamfered conventionally, and two corners respectively protruding from the display portion 11 and the first back panel layer 61 are formed on the support layer That is to say, the second support portion 22 protruding from the display portion 11 and the first back panel layer 61 and two second support sub-portions 221 located on the two opposite sides of the bent portion 12 are formed. In addition, a buffer sub-portion 31 is formed on each second support sub-portion 221, to form the buffer portion 30.

Optionally, the buffer portion 30 and the second support portion 22 are integrally disposed. In a manufacturing process, process parameters for chamfering the support layer may be controlled to cause thicknesses at the two corners on which the second support sub-portions 221 are formed are greater than thicknesses at other positions on the support layer 20, so as to form a corresponding buffer sub-portion 31 on each second support sub-portion 221.

Further, in this embodiment, the display device further includes a cover plate 50 disposed on a side of the display portion 11 facing away from the bonding portion 13. A distance from the top of the buffer portion 30 to the cover plate 50 in the first direction X is less than or equal to 5 mm. That is to say, in this embodiment, the top of the buffer portion may protrude out of the upper surface of the cover plate 50, or may be lower than the upper surface of the cover plate 50. The top of the buffer portion protrudes out of the upper surface of the cover plate 50 by a distance less than or equal to 5 mm. The top of the buffer portion is lower than the upper surface of the cover plate 50 by a distance less than or equal to 5 mm.

In this embodiment, the support layer 20 is reused as the metal support plate 62. Since the buffer portion 30 and the support layer 20 are integrally disposed, materials of the buffer portion 30 and the support layer 20 may both include a stainless steel material.

It should be noted that, in all of the above embodiments provided in this application, the support layer 20 is reused as the metal support plate 62. That is to say, the buffer portion 30 is always disposed on the metal support plate 62. In other embodiments of this application, the support layer 20 may also be reused as the first back panel layer 61. That is to say, a side of the first back panel layer 61 close to the bent portion 12 extends outward to form the second support portion, and a buffer portion is disposed on the second support portion. A length of the buffer portion in the first direction X is greater than a distance from any position on the bent sub-portion 121 to a plane where a surface on a side of the first back panel layer 61 away from the bonding portion 13 is located in the first direction X. In this way, squeeze and collision between the bent portion 12 and the outer frame can be avoided.

Based on the above, the display module 10 in this application includes the display portion 11 and the bonding portion 13 disposed opposite to each other, the bent portion 12 configured for bending and connected to the display portion 11, and the support layer 20. The support layer 12 includes the first support portion 21 located between the display portion 11 and the bonding portion 13 and the second support portion 22 extending from the first support portion 21 to the bent portion 12. According to the embodiments of this application, the buffer portion 30 is disposed on the side of the second support portion 22 close to the display portion 11, and the length of the buffer portion 30 in the first direction X is greater than a distance from any position on the bent portion 12 to the support layer 20 in the first direction. The first direction X is the thickness direction along the display portion 11. The buffer portion 30 can avoid squeeze and collision between the bent portion 12 and other components close to a side of the display portion 11. Therefore, the yield of a display panel can be increased.

A display device provided in the embodiments of this application is described above in detail. Although the principles and implementations of this application are described by using specific examples in this specification, the descriptions of the foregoing embodiments are merely used for helping understand the technical solutions and the core idea of the technical solutions of this application. A person of ordinary skill in the art should understand that modifications may be still made to the technical solutions described in the foregoing embodiments or equivalent replacements may be made to some technical features thereof, as long as such modifications or replacements do not make the essence of corresponding technical solutions depart from the scope of the technical solutions of the embodiments of this application.

What is claimed is:

1. A display device, comprising: a display module, comprising a display portion and a bonding portion disposed opposite to each other and a bent portion connected between the display portion and the bonding portion; a support layer, comprising a first support portion disposed between the display portion and the bonding portion and a second support portion disposed on a side of the first support portion close to the bent portion, wherein a projection of the second support portion in a first direction is located outside a projection of the bent portion in the first direction, and the first direction is a thickness direction along the display portion; and a buffer portion, disposed on a side of the second support portion close to the display portion, wherein the bent portion comprises a bent sub-portion located on a side of a first plane facing the display portion, the first plane is a plane where a surface on a side of the second support portion away from the bonding portion is located, and a length of the buffer portion in the first direction is greater than or equal to a distance from any position on the bent sub-portion to the first plane in the first direction; and the display portion comprises a first surface away from a side of the bonding portion, the bent portion comprises a second surface connected to the first surface, the display module further comprises a protective adhesive layer disposed on the second surface, and the protective adhesive layer comprises a first protective adhesive layer corresponding to the bent sub-portion, wherein a length of the buffer portion in the first direction is greater than or equal to a distance from any position on the first protective adhesive layer to the first plane in the first direction; and the second support portion comprises the two second support sub-portions extending along two opposite sides of the first support portion respectively, the buffer portion comprises the two buffer sub-portions located on the two opposite sides of the bent portion, and one buffer sub-portion is disposed on the each support sub-portion.

2. The display device according to claim 1, wherein the first support portion and the second support portion are integrally disposed.

3. The display device according to claim 1, wherein the buffer portion and the second support portion are integrally disposed.

4. The display device according to claim 1, wherein a distance from the buffer portion to a plane where a face of intersection of the display portion and the bent portion is located in a second direction is greater than or equal to a distance from any position on the protective adhesive layer to the plane where the face of intersection of the display portion and the bent portion is located in the second direction, wherein the second direction is perpendicular to the first direction.

5. The display device according to claim 1, wherein the display device further comprises a first back plate layer and a metal support plate disposed between the display portion and the bonding portion, and the support layer is the back plate layer or the metal support plate.

6. The display device according to claim 1, wherein the display device further comprises a cover plate disposed on a side of the display portion away from the bonding portion, and a distance from a top part of the buffer portion to the cover plate in the first direction is less than or equal to 5 mm.

7. The display device according to claim 1, wherein the display device further comprises an outer frame, and the display module, the support layer, and the buffer portion are all disposed in the outer frame.

8. A display device, comprising: a display module, comprising a display portion and a bonding portion disposed opposite to each other and a bent portion connected between the display portion and the bonding portion; a support layer, comprising a first support portion disposed between the display portion and the bonding portion and a second support portion disposed on a side of the first support portion close to the bent portion, wherein a projection of the second support portion in a first direction is located outside a projection of the bent portion in the first direction, and the first direction is a thickness direction along the display portion; a buffer portion, disposed on a side of the second support portion close to the display portion; and an outer frame, wherein the display module, the support layer, and the buffer portion are all disposed in the outer frame, wherein the bent portion comprises a bent sub-portion located on a side of a first plane facing the display portion, the first plane is a plane where a surface on a side of the second support portion away from the bonding portion is located, and a length of the buffer portion in the first direction is greater than or equal to a distance from any position on the bent sub-portion to the first plane in the first direction; and the display portion comprises a first surface away from a side of the bonding portion, the bent portion comprises a second surface connected to the first surface, the display module further comprises a protective adhesive layer disposed on the second surface, and the protective adhesive layer comprises a first protective adhesive layer corresponding to the bent sub-portion, wherein a length of the buffer portion in the first direction is greater than or equal to a distance from any position on the first protective adhesive layer to the first plane in the first direction; and the second support portion comprises the two second support sub-portions extending along two opposite sides of the first support portion respectively, the buffer portion comprises the two buffer sub-portions located on the two opposite sides of the bent portion, and one buffer sub-portion is disposed on the each support sub-portion.

9. The display device according to claim 8, wherein the first support portion and the second support portion are integrally disposed.

10. The display device according to claim 8, wherein the buffer portion and the second support portion are integrally disposed.

11. The display device according to claim 8, wherein a distance from the buffer portion to a plane where a surface of intersection of the display portion and the bent portion is located in a second direction is greater than or equal to a distance from any position on the protective adhesive layer to the plane where the surface of intersection of the display portion and the bent portion is located in the second direction, wherein the second direction is perpendicular to the first direction.

12. The display device according to claim 8, wherein the display device further comprises a first back plate layer and a metal support plate disposed between the display portion and the bonding portion, and the support layer is the back panel layer or the metal support plate.

13. The display device according to claim 8, wherein the display device further comprises a cover plate disposed on a side of the display portion away from the bonding portion, and a distance from a top part of the buffer portion to the cover plate in the first direction is less than or equal to 5 mm.

\* \* \* \* \*